(12) United States Patent
Yu et al.

(10) Patent No.: US 8,828,528 B2
(45) Date of Patent: Sep. 9, 2014

(54) BARRIER FILM AND METHOD OF MANUFACTURING THE SAME

(75) Inventors: Andrew Chakchung Yu, Miyagi (JP); Hiroaki Ono, Miyagi (JP); Takahiro Kawana, Miyagi (JP)

(73) Assignee: Sony Corporation, Tokyo (JP)

( * ) Notice: Subject to any disclaimer, the term of this patent is extended or adjusted under 35 U.S.C. 154(b) by 246 days.

(21) Appl. No.: 13/271,434

(22) Filed: Oct. 12, 2011

(65) Prior Publication Data

US 2012/0107586 A1 May 3, 2012

(30) Foreign Application Priority Data

Nov. 1, 2010 (JP) ................................. 2010-245132

(51) Int. Cl.
| | | |
|---|---|---|
| *B32B 7/02* | (2006.01) | |
| *B32B 19/00* | (2006.01) | |
| *C23C 16/40* | (2006.01) | |
| *C23C 16/455* | (2006.01) | |

(52) U.S. Cl.
CPC ......... *C23C 16/403* (2013.01); *C23C 16/45555* (2013.01)
USPC ...................... 428/216; 428/701; 427/255.34

(58) Field of Classification Search
None
See application file for complete search history.

(56) References Cited

U.S. PATENT DOCUMENTS

| | | | | |
|---|---|---|---|---|
| 2008/0182101 A1* | 7/2008 | Carcia et al. | ................... | 428/332 |
| 2010/0132762 A1* | 6/2010 | Graham et al. | ................ | 136/244 |

FOREIGN PATENT DOCUMENTS

| | | |
|---|---|---|
| JP | 2003-332042 | 11/2003 |
| JP | 2007-090803 | 4/2007 |
| JP | 2007-516347 | 6/2007 |
| JP | 4254350 | 2/2009 |
| JP | 2012-526906 | 11/2012 |

OTHER PUBLICATIONS

Japanese Office Action issued Jun. 24, 2014 in corresponding Japanese Patent Application No. 2010245132.

* cited by examiner

*Primary Examiner* — David Sample
*Assistant Examiner* — Nicole T Gugliotta
(74) *Attorney, Agent, or Firm* — K&L Gates LLP (57) ABSTRACT

A barrier film includes a base which is formed of a plastic film having a first surface and a second surface opposed to the first surface, a first barrier layer which is formed on the first surface by an atomic layer deposition method and is made of an inorganic material having a water vapor barrier property; and a second barrier layer which is formed on the second surface by an atomic layer deposition method and is made of an inorganic material having a water vapor barrier property.

9 Claims, 4 Drawing Sheets

BARRIER FILM AND METHOD OF MANUFACTURING THE SAME

CROSS REFERENCES TO RELATED APPLICATIONS

The present application claims priority to Japanese Patent Application No. 2010-245132 filed on Nov. 1, 2010, the disclosure of which is incorporated herein by reference.

BACKGROUND

The present disclosure relates to a barrier film having a barrier property against water vapor and the like and a method of manufacturing the barrier film.

There have been known barrier films in which a metal oxide thin film such as an aluminum oxide or a silicon oxide is formed on a surface of a plastic film. These kinds of barrier film are widely used in packing for products which may be blocked from oxygen or water vapor and packing for preventing the deterioration of food, industrial products, medical products and the like. In recent years, barrier films have also been widely applied to electronics fields such as solar cells and display elements such as organic ELs in addition to packing applications.

For example, in Japanese Patent No. 4254350, there is a description of a transparent barrier film in which an organic matter layer 1, an inorganic matter layer 1, an organic matter layer 2, and an inorganic matter layer 2 are stacked on a resin base in this order and a water vapor transmission rate is less than 30 g/m$^2$/day. Furthermore, Japanese Unexamined Patent Application Publication No. 2007-90803 discloses a gas barrier film having a structure in which at least one inorganic barrier layer which is formed using an atomic layer deposition method (ALD method) and at least one organic layer are alternately stacked on a plastic substrate.

SUMMARY

In recent years, for example, it has been necessary for barrier films for electronics to have performance of a water vapor transmission rate of, for example, 1E-4 (1×10$^{-4}$) [g/m$^2$/day] or less in order to prevent the deterioration of the performance of an element vulnerable to moisture for a certain period of time. However, in Japanese Patent No. 4254350 and Japanese Unexamined Patent Application Publication No. 2007-90803, there is no description of a gas barrier film having a water vapor transmission rate equal to or less than an order of a power of minus four.

It is desirable to provide a barrier film which has a water vapor transmission rate equal to or less than an order of a power of minus four and a method of manufacturing the barrier film.

According to an embodiment of the present disclosure, a barrier film has a base, a first barrier layer, and a second barrier layer.

The base has a first surface and a second surface opposed to the first surface and is formed of a plastic film.

The first barrier layer is formed on the first surface by an atomic layer deposition method and is made of an inorganic material having a water vapor barrier property.

The second barrier layer is formed on the second surface by an atomic layer deposition method and is made of an inorganic material having a water vapor barrier property.

The barrier film has a barrier layer which is formed by an atomic layer deposition method (also referred to as the ALD method) not only on one surface of the base but also on the other surface. Accordingly, since a dense film having a high coverage property is formed on both of the surfaces of the base, a barrier film having a water vapor transmission rate equal to or less than an order of a power of minus four can be obtained.

The first and second barrier layers can use an aluminum oxide film which is formed at a pressure equal to or greater than 0.3 Torr and equal to or less than 10 Torr (equal to or greater than 39.99 Pa and equal to or less than 1333 Pa).

The aluminum oxide film which is formed under the pressure condition has a higher packing density than an aluminum oxide film which is formed under the pressure condition of, for example, 0.1 to 0.2 Torr (13.3 to 26.6 Pa). Accordingly, the first and second barrier layers can be made dense and it is possible to realize a water vapor transmission rate equal to or less than 10×10$^{-5}$ [g/m$^2$/day].

The barrier film may further have a third barrier layer and a fourth barrier layer.

The third barrier layer is formed between the first surface and the first barrier layer by a sputtering method and is made of an inorganic material having a water vapor barrier property.

The fourth barrier layer is formed between the second surface and the second barrier layer by a sputtering method and is made of an inorganic material having a water vapor barrier property.

A method of manufacturing a barrier film according to another embodiment of the present disclosure includes forming a first barrier layer which is made of an inorganic material having a water vapor barrier property on a first surface of a plastic film by an atomic layer deposition method in a vacuum chamber in which a pressure equal to or greater than 0.5 Torr and equal to or less than 5 Torr is maintained.

In the vacuum chamber, a second barrier layer which is made of an inorganic material having a water vapor barrier property is formed on a second surface opposed to the first surface of the plastic film by an atomic layer deposition method.

In the manufacturing method, it is possible to form a thin film having a higher packing density than an aluminum oxide film which is formed under the pressure condition of, for example, 0.1 to 0.2 Torr (13.3 to 26.6 Pa). Accordingly, the first and second barrier layers can be made dense and it is possible to realize a water vapor transmission rate equal to or less than 10×10$^{-5}$ [g/m$^2$/day].

According to the embodiments of the present disclosure, it is possible to obtain a barrier film having an excellent water vapor barrier property.

Additional features and advantages are described herein, and will be apparent from the following Detailed Description and the figures.

DETAILED DESCRIPTION

Embodiments of the present application will be described below in detail with reference to the drawings.

<First Embodiment>

[Barrier Film]

Figure 1:
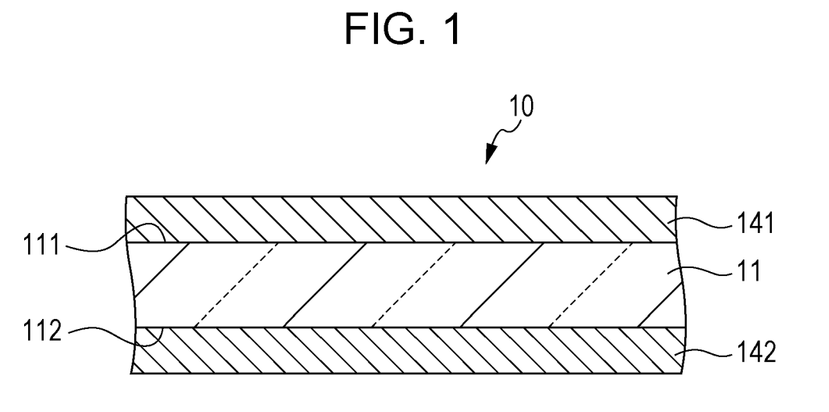
FIG. 1 is a cross-sectional view schematically showing a barrier film according to a first embodiment of the present disclosure.

FIG. 1 is a cross-sectional view schematically showing a barrier film according to a first embodiment of the present disclosure. A barrier film 10 of this embodiment has a laminate structure of a base 11, a first barrier layer 141, and a second barrier layer 142.

(Base)

The base 11 has a front surface 111 (first surface) and a rear surface 112 (second surface) opposed to the front surface 111. In this embodiment, the base 11 is formed of a flexible plastic film.

As this kind of plastic film, a translucent plastic material is used. Examples thereof include polycarbonate (PC), polyethylene terephthalate (PET), polyethylene naphthalate (PEN), polyether sulfone (PES), polystyrene (PS), aramid, triacetylcellulose (TAC), cycloolefin polymer (COP), polymethylmethacrylate (PMMA) and the like.

The thickness of the base 11 is not particularly limited. For example, the thickness is equal to greater than 10 μm and equal to or less than 1000 μm. When the thickness is equal to or less than 10 μm, there is a concern that a handling property and reliability are reduced. On the other hand, when the thickness is greater than 1000 μm, the light transmission is significantly reduced. The thickness of the base 11 is preferably equal to or greater than 50 μm and equal to or less than 200 μm. Particularly, when the base 11 is formed in a thickness of 200 μm or less, a film forming process in a roll-to-roll manner to be described later is easily applied.

(First and Second Barrier Layers)

The first and second barrier layers 141 and 142 are made of a translucent inorganic material having a water vapor barrier property. Examples of this kind of inorganic material include oxides, nitrides and the like including at least one of metal elements such as Al, Zn, Si, Cr, Zr, Cu and Mg.

With regard to the inorganic material constituting the first and second barrier layers 141 and 142, the first and second barrier layers 141 and 142 may be formed using the same kind of material or using different kinds of materials. In this embodiment, the first and second barrier layers 141 and 142 are made of aluminum oxide (alumina).

The first barrier layer 141 is formed on the front surface 111 of the base 11 by an ALD method. The second barrier layer 142 is formed on the rear surface 112 of the base 11 by an ALD method. The larger the thicknesses of the first and second barrier layers 141 and 142, the higher the water vapor barrier property thereof. However, when the thickness is too large, warpage or cracks due to the internal stress may occur. From this point of view, the barrier layers 141 and 142 have a thickness equal to or greater than 10 nm and equal to or less than 200 nm, preferably equal to or greater than 10 nm and equal to or less than 100 nm, and more preferably equal to or greater than 20 nm and equal to or less than 50 nm.

The first and second barrier layers 141 and 142 may be formed to have the same or similar thickness or have different thicknesses. In this embodiment, the first and second barrier layers 141 and 142 are formed to have the same thickness.

(Method of Forming First and Second Barrier Layers)

Here, a method of forming the first and second barrier layers 141 and 142 will be described. In the following description, the first and second barrier layers 141 and 142 will be collectively referred to as "the barrier layer 14" except when these are individually described.

As described above, the barrier layer 14 is formed by an ALD method. The ALD method is a thin film forming method in which a plurality of kinds of raw material gases (precursor gases) are alternately introduced into a chamber and a reaction product is deposited one atomic layer at a time on the surface of the base installed in the chamber. A method of forming a plasma in the chamber (plasma ALD method), a method of heating the base (thermal ALD method) and the like have been known to promote the reaction of the raw material gases, and any method can be applied.

When the barrier layer 14 is formed of an aluminum oxide thin film, a first precursor gas and a second precursor gas are used. Examples of the first precursor gas include trimethylaluminum (TMA; $(CH_3)_3Al$) and the like. Examples of the second precursor gas include water ($H_2O$) and the like.

Other than the above materials, the following materials can be used as these precursor gases.

Examples thereof include bis(tert-butylimino)bis(dimethylamino) tungsten (VI); $((CH_3)_3CN)_2W(N(CH_3)_2)_2$, tris (tert-butoxy)silanol; $((CH_3)_3CO)_3SiOH$, diethyl zinc; $(C_2H_5)_2Zn$, tris(diethylamide)(tert-butylimide)tantalum(V); $(CH_3)_3CNTa(N(C_2H_5)_2)_3$, tris(tert-pentoxy)silanol; $(CH_3CH_2C(CH_3)_2O)_3SiOH$, trimethyl (methylcyclopentadienyl)platinum(IV); $C_5H_4CH_3Pt(CH_3)_3$, bis(ethylcyclopentadienyl) ruthenium(II); $C_7H_9RuC_7H_9$, (3-aminopropyl)triethoxysilane; $H_2N(CH_2)_3Si(OC_2H_5)_3$, silicon tetrachloride; $SiCl_4$, titanium tetrachloride; $TiCl_4$, titanium(IV) isopropoxide; $Ti[(OCH)(CH_3)_2]_4$, tetrakis(dimethylamide)titanium (IV); $[(CH_3)_2N]_4Ti$, tetrakis (dimethylamide)zirconium(IV); $[(CH_3)_2N]_4Zr$, tris[N,N-bis(trimethylsilyl)amide]yttrium; and $[[(CH_3)_3Si]_2N]_3Y$.

FIGS. 2A to 2D show a process drawing describing a thin film forming method by ALD. Here, a batch process is exemplified to describe a method of forming the barrier layer 14, but as will be described later, a film forming process in a roll-to-roll manner can also be applied.

As shown in FIGS. 2A to 2D, when a base film 15 is sequentially exposed to a first precursor gas 16A, a purge gas 16P, a second precursor gas 16B, and a purge gas 16P, an aluminum oxide monolayer 14C is formed. The base film 15 corresponds to the base 11 shown in FIG. 1.

Figure 2A:
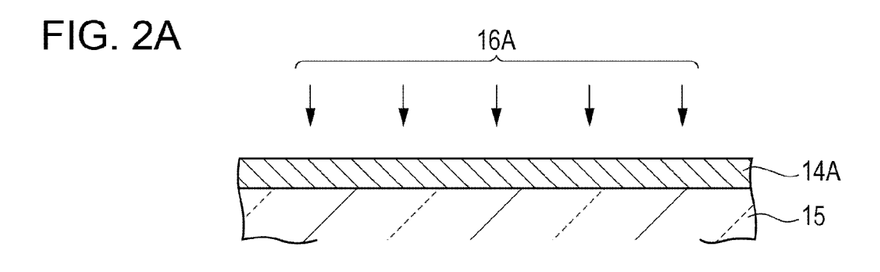
FIGS. 2A to 2D show a process drawing describing a method of forming first and second barrier layers of the barrier film.

The base film 15 is transported into a chamber evacuated to a predetermined pressure. As shown in FIG. 2A, the first precursor gas 16A introduced into the chamber is adsorbed on a front surface of the base film 15, and thus a first precursor layer 14A formed of the precursor gas 16A is formed on the front surface of the base film 15.

Figure 2B:
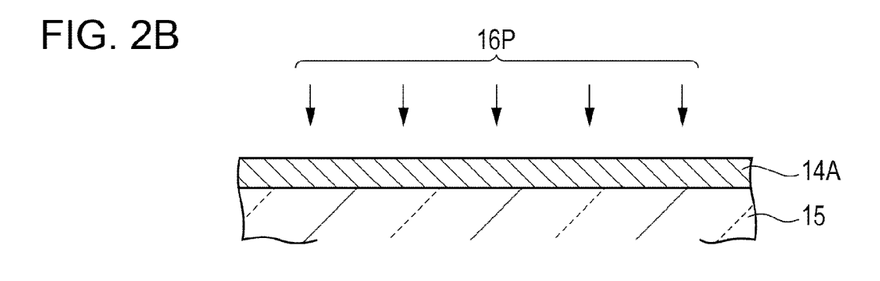

Next, as shown in FIG. 2B, the purge gas 16P is introduced into the chamber. Therefore, the front surface of the base film 15 is exposed to the purge gas 16P, and the unattached precursor gas 16A which remains on the front surface of the base film 15 is removed. When forming an aluminum oxide thin film, for example, argon (Ar) is used as the purge gas 16P. In addition, nitrogen, hydrogen, oxygen, carbon dioxide and the like can be used as the purge gas.

Figure 2C:
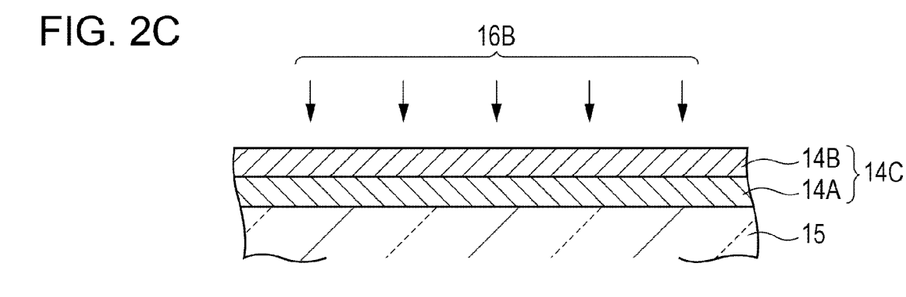
Figure 2D:
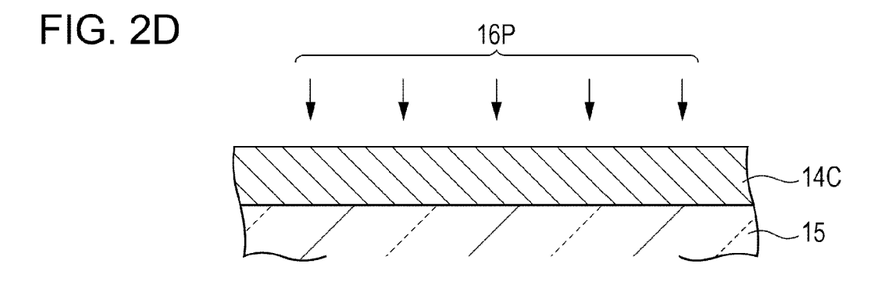

Next, as shown in FIG. 2C, the second precursor gas 16B is introduced into the chamber. The second precursor gas 16B is adsorbed on the front surface of the base film 15, and a second precursor layer 14B formed of the precursor gas 16B is formed on the first precursor layer 14A. As a result, the first precursor layer 14A and the second precursor layer 14B chemically react with each other, and thus the aluminum oxide monolayer 14C is formed. Then, as shown in FIG. 2D, the purge gas 16P is introduced again into the chamber, and the unattached precursor gas 16B which remains on the front surface of the base film 15 is removed.

The barrier layer 14 is formed in a predetermined thickness on the front surface of the base film 15 by repeating the above-described process.

Figure 3:
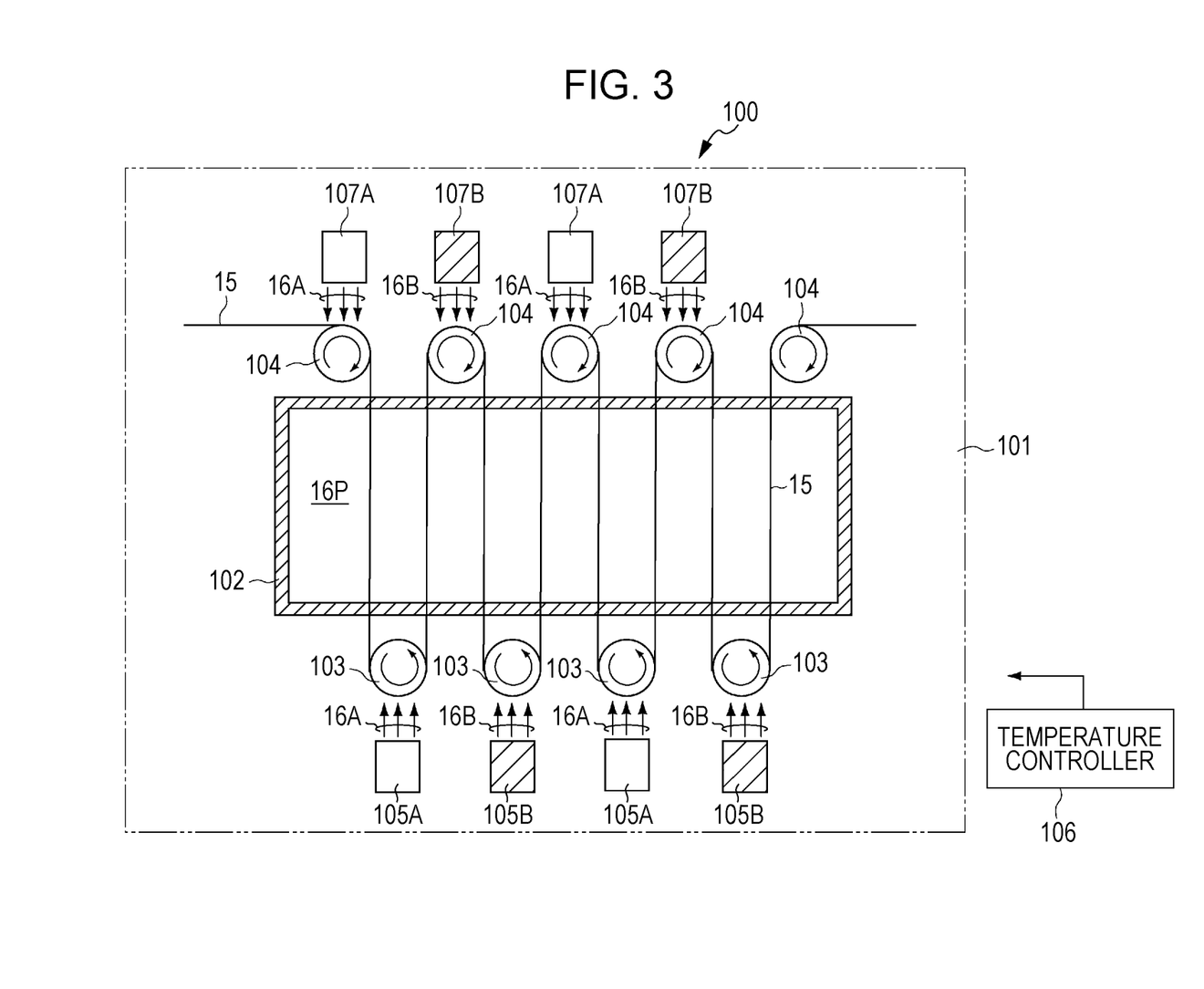
FIG. 3 is a cross-sectional view schematically showing a film forming device which forms the first and second barrier layers.

FIG. 3 is a cross-sectional view schematically showing an example of a film forming device (barrier film manufacturing device) for forming the first barrier layer 141 and the second barrier layer 142 on both of the surfaces of the base film 15 in a roll-to-roll manner.

A film forming device 100 has a vacuum chamber 101 which is evacuated to a predetermined pressure (0.3 to 10 Torr (39.99 to 1333 Pa), an internal chamber 102 which is filled with the purge gas 16P, and a transport mechanism which transports the base film 15 in the vacuum chamber 101. Furthermore, the film forming device 100 has ALD heads 105A and 105B which eject the precursor gases 16A and 16B to the front surface of the base film 15, ALD heads 107A and 107B which eject the precursor gases 16A and 16B to the rear surface of the base film 15, and a temperature controller 106 which is installed outside the vacuum chamber 101.

The transport mechanism has an unwinding roller which unwinds the band-like base film 15, a winding roller which winds the base film 15, and a plurality of guide rollers 103 and 104 which are installed between both of the rollers. The guide rollers 103 and 104 are respectively arranged outside the side walls of the internal chamber 102 which are opposed to each other, and the base film 15 is transported while being alternately guided to the guide roller 103 and the guide roller 104. In this example, both of the guide rollers 103 and 104 are arranged so that the front surface of the base film 15 is brought into contact with the guide roller 103 and the rear surface of the base film 15 is brought into contact with the guide roller 104. In addition, each of the guide rollers 103 and 104 is configured so that a surface temperature thereof can be adjusted in accordance with a command from the temperature controller 106.

A plurality of slots through which the base material 15 can pass are formed in both the side walls of the internal chamber 102. Each slot is formed in an area where the base film 15 which is linearly laid between the guide rollers 103 and 104 passes. Accordingly, the base film 15 can enter and leave the internal chamber 102 for each passing between the guide rollers 103 and 104.

The ALD heads 105A and the 105B are arranged opposed to the respective guide rollers 103 and eject the precursor gases 16A and 16B toward the front surface of the base film 15 on each of the guide rollers 103. One ALD head 105A ejects the first precursor gas 16A and the other ALD head 105B ejects the second precursor gas 16B. In this example, the ALD heads 105A and 105B are alternately arranged opposed to the respective guide rollers 103 in a direction of the transport of the base film 15.

The ALD heads 107A and 107B are arranged opposed to the respective guide rollers 104 and eject the precursor gases 16A and 16B toward the rear surface of the base film 15 on each of the guide rollers 104. One ALD head 107A ejects the first precursor gas 16A and the other ALD head 107B ejects the second precursor gas 16B. In this example, the ALD heads 107A and 107B are alternately arranged opposed to the respective guide rollers 104 in a direction of the transport of the base film 15.

Although not shown in the drawing, the film forming device 100 further includes an exhaust line for exhausting the inside of the vacuum chamber 101, a purge gas introduction line which supplies the purge gas 16P to the internal chamber 102, a precursor gas introduction line which supplies a precursor gas to the ALD heads 105A, 105B, 107A, and 107B, and the like.

In the film forming device 100 having the above-described configuration, as shown in FIG. 3, the base film 15 is sequentially transported to the ALD heads 105A, 105B, 107A and 107B by the transport mechanism including the guide rollers 103 and 104 and the like. The base film 15 is exposed to the first precursor gas 16A which is ejected from the ALD head 105A (107A) (FIG. 2A), and then exposed to the purge gas 16P in the internal chamber 102 (FIG. 2B). Next, the base film 15 is exposed to the second precursor gas 16B which is ejected from the ALD head 105B (107B) (FIG. 2C), and then exposed to the purge gas 16P in the internal chamber 102 (FIG. 2D). The first barrier layer 141 and the second barrier layer 142 are formed on the front surface and the rear surface of the base film 15, respectively, by sequentially repeating the process.

The amounts of the precursor gases 16A and 16B and the purge gas 16P to which the base film 15 is exposed, an exposure time, and the like are adjusted in accordance with a transport speed of the base film 15, the amounts of gases which are ejected from the ALD heads 105A, 105B, 107A and 107B, the size of the internal chamber 102, and the like.

In this manner, the barrier film 10 shown in FIG. 1 is manufactured. The barrier film 10 of this embodiment has the first barrier layer 141 and the second barrier layer 142 which are formed by an ALD method on the front surface 111 and the rear surface 112 of the base 11, respectively. Accordingly, since the dense films having a high coverage property are formed on both of the surfaces of the base 11, it is possible to realize a water vapor transmission rate equal to or less than an order of a power of minus four. Therefore, according to the barrier film 10 of this embodiment, an excellent water vapor barrier property can be obtained.

The densities of the first and second barrier layers 141 and 142 can be adjusted by the pressure condition upon film formation. That is, there is a tendency that the larger the pressure upon film formation, the higher the packing density of the formed film. For example, when a packing density of an aluminum oxide film which is formed under the general pressure condition of 0.1 to 0.2 Torr (13.3 to 26.6 Pa) in the ALD film formation is set to 1, a packing density of an aluminum oxide film which is formed at a pressure of 0.3 to 10 Torr (39.99 to 1333 Pa) is improved by up to 1.01 to 1.10.

As described above, the packing densities of the barrier layers 141 and 142 correlate strongly with the base pressure (hereinafter, also referred to as the film forming pressure) in the vacuum chamber upon film formation. The water vapor barrier property of the barrier film 10 depends significantly not only on the thicknesses of the first and second barrier layers 141 and 142, but also on the packing densities thereof. For example, the film forming pressure of the barrier layers 141 and 142 for realizing a water vapor transmission rate [$g/m^2/day$] equal to or less than an order of a power of minus four is in the range of 0.3 to 10 Torr.

When the film forming pressure is less than 0.3 Torr, a packing density increasing effect is small and it is difficult to realize a water vapor transmission rate equal to or less than an order of a power of minus four. On the other hand, when the film forming pressure is greater than 10 Torr, the mean free path is extremely shortened, and thus the film forming efficiency is reduced and the consumption amounts of the raw material gases are increased. The film forming pressure at which the improvement in the barrier property and the securing of productivity can be balanced is equal to or greater than 0.3 Torr and equal to or less than 5 Torr (equal to or greater than 39.99 Pa and equal to or less than 666.5 Pa). In addition, it is possible to obtain a water vapor transmission rate of $10 \times 10^{-5}$ to $10^{-7}$ [g/m$^2$/day] by setting the film forming pressure to be equal to or greater than 0.5 Torr and equal to or less than 3 Torr.

Hereinafter, experimental examples carried out by the inventors will be described. A plurality of samples different in configuration and film forming conditions were prepared and the water vapor transmission rates (WVTRs) of the samples were compared with each other. The configuration and the film forming conditions for each sample are as follows.

(Sample 1)

As Sample 1, a base formed of a single-layer plastic film was used. A polyethylene naphthalate (PEN) film having a thickness of 125 μm was used for the base.

(Sample 2)

Figure 4A:
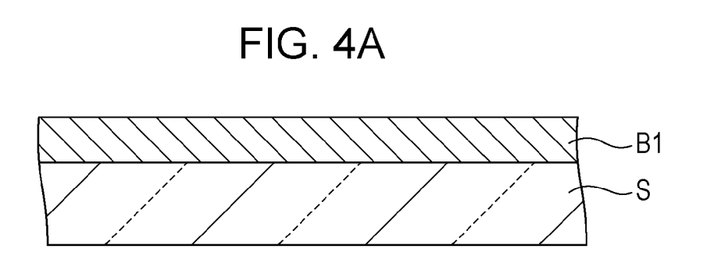
FIGS. 4A and 4B show cross-sectional views schematically showing various sample barrier films.

The configuration of Sample 2 is shown in FIG. 4A. Sample 2 has a laminate structure of a base S constituting Sample 1 and an inorganic barrier layer B1 formed on one surface of the base S. The inorganic barrier layer B1 is an aluminum oxide thin film having a thickness of 20 nm, which is formed by an ALD method.

The inorganic barrier layer B1 is formed by the method shown in FIGS. 2A to 2D. Here, the base pressure in the chamber was a nitrogen atmosphere of 0.2 Torr (26.66 Pa). TMA was used as a first precursor gas, H$_2$O was used as a second precursor gas, and nitrogen was used as a purge gas.

(Sample 3)

Sample 3 has the structure shown in FIG. 4A. A barrier layer B1 was formed under the same conditions as in Sample 2, except that the thickness of the barrier layer B1 was 50 nm.

(Sample 4)

Sample 4 has the structure shown in FIG. 4A. A barrier layer B1 was formed under the same conditions as in Sample 2, except that the thickness of the barrier layer B1 was 60 nm.

(Sample 5)

Sample 5 has the structure shown in FIG. 4A. A barrier layer B1 was formed under the same conditions as in Sample 2, except that the thickness of the barrier layer B1 was 25 nm.

(Sample 6)

Figure 4B:
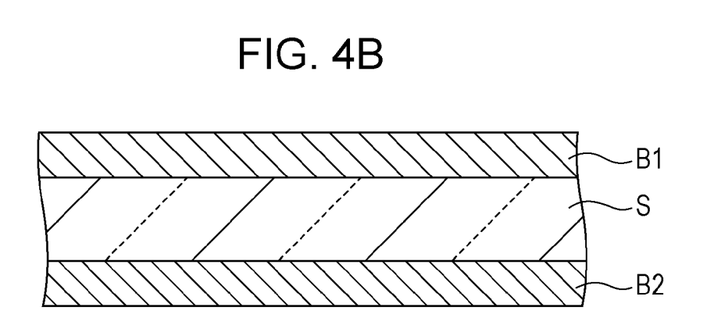

The configuration of Sample 6 is shown in FIG. 4B. Sample 6 has a laminate structure of a base S constituting Sample 1, an inorganic barrier layer B1 which is formed on one surface of the base S, and a second inorganic barrier layer B2 which is formed on the other surface of the base S. The inorganic barrier layers B1 and B2 are aluminum oxide thin films having a thickness of 30 nm, which are formed by an ALD method.

The inorganic barrier layers B1 and B2 were formed by the method shown in FIGS. 2A to 2D. Here, the base pressure in the chamber was a nitrogen atmosphere of 0.6 Torr (666.5 Pa). TMA was used as a first precursor gas, H$_2$O was used as a second precursor gas, and nitrogen was used as a purge gas. The processing times of the processes shown in FIGS. 2A, 2B, 2C, and 2D were denoted by T1 (sec), T2 (sec), T3 (sec), and T4 (sec), respectively, and one cycle set as the total time of T1 to T4 was repeated plural times until a thickness of 20 nm was obtained. In addition, T1 was set in the range of 0.01 to 1, T2 was set in the range of 5 to 200, T3 was set in the range of 0.01 to 2, and T4 was set in the range of 5 to 700.

(Sample 7)

Sample 7 has the structure shown in FIG. 4B. Barrier layers B1 and B2 were formed under the same conditions as in Sample 6, except that the thicknesses of the barrier layers B1 and B2 were 50 nm.

(Sample 8)

Sample 8 has the structure shown in FIG. 4B. Barrier layers B1 and B2 were formed under the same conditions as in Sample 6, except that the thicknesses of the barrier layers B1 and B2 were 25 nm.

The water vapor transmission rates (WVTR) of Samples 1 to 8 were measured. In the measurement, a calcium corrosion observing device "MFB 1000", manufactured by Mitsuwa Frontech Corp., was used. The measurement conditions were 40° C. and 90% RH (relative humidity). Table 1 shows the measurement results.

TABLE 1

| | Structure | WVTR (g/m$^2$/day) | Pressure (Torr) |
|---|---|---|---|
| Sample 1 | Polymer film (PEN) | E0~1 | — |
| Sample 2 | PEN/ALD20 nm | 2.6E-2 | 2E-1 |
| Sample 3 | PEN/ALD50 nm | 2.0E-3 | 2E-1 |
| Sample 4 | PEN/ALD60 nm | 3.6E-4 | 2E-1 |
| Sample 5 | PEN/ALD25 nm | 1.8E-3 | 6E-1 |
| Sample 6 | ALD30 nm/PEN/ALD30 nm | 5.2E-4 | 2E-1 |
| Sample 7 | ALD50 nm/PEN/ALD50 nm | 2.8E-4 | 2E-1 |
| Sample 8 | ALD25 nm/PEN/ALD25 nm | E-7~-6 | 6E-1 |

When comparing Samples 2, 3, and 4, it was found that the larger the film thickness of the ALD layer (barrier layer), the higher the water vapor barrier property which could be obtained. This shows that the coverage property with respect to the base material surface closely relates to the water vapor barrier property, and the film thickness of ALD and the coverage property correlate strongly with each other.

When comparing Samples 3 and 5, a water vapor transmission rate of an order of a power of minus three was obtained in both cases. From the result of Sample 5, it was found that by increasing the film forming pressure to three times larger than that of Sample 3, the same water vapor barrier property as that of Sample 3 was obtained with a thickness half the thickness of the ALD layer of Sample 3.

In addition, when comparing Samples 4, 6, and 7, a water vapor transmission rate of an order of a power of minus four was obtained in all cases. Accordingly, it was found that the water vapor barrier property depends on a total thickness of the ALD layer. Furthermore, from the result of Sample 8, it was found that by increasing the film forming pressure to three times larger than that of Sample 6, a water vapor transmission rate of a power of minus seven to minus six was obtained with a thickness half the thickness of the ALD layer of Sample 6. In two measurement areas, the specific water vapor transmission rates of Sample 8 were 3.0E-6 and 7.7E-7, respectively.

As is obvious from the above-described results, according to the barrier film 10 of this embodiment shown in FIG. 1, it is possible to realize a water vapor transmission rate [g/m$^2$/day] equal to or less than an order of a power of minus four, and it is possible to obtain an extremely high water vapor barrier property.

In addition, the water vapor transmission rate can be reduced up to an order of a power of minus seven by setting the film forming pressures of the first and second barrier layers 141 and 142 to be higher than a normal pressure condition.

According to the barrier film 10 of this embodiment, since all of the layers are translucent, the barrier film 10 can be preferably used as a barrier film which may have transparency for use in, for example, organic EL displays and solar cell modules.

Furthermore, since the barrier film 10 has appropriate flexibility, the barrier film 10 can be curved in a desired shape to be used.

<Second Embodiment>

Figure 5:
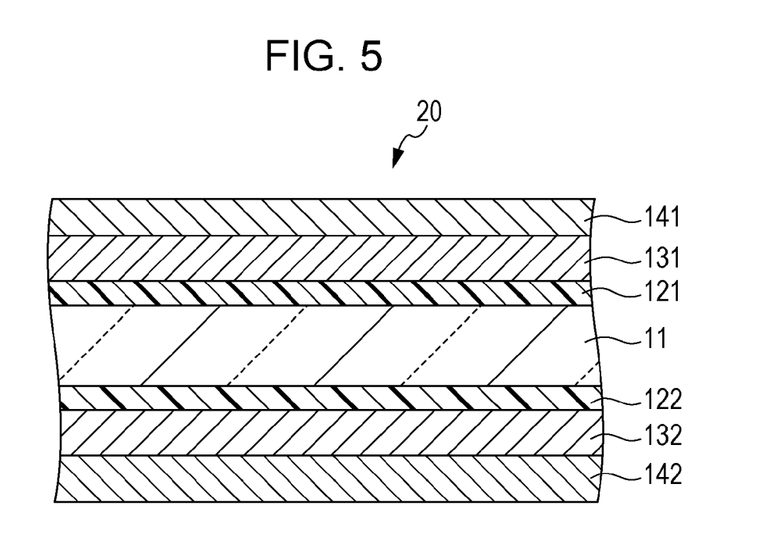
FIG. 5 is a cross-sectional view schematically showing a barrier film according to a second embodiment of the present disclosure.

FIG. 5 is a cross-sectional view schematically showing a barrier film according to a second embodiment of the present disclosure. In this embodiment, a description of the same configurations and actions as in the first embodiment will be omitted or simplified, and different portions from those in the first embodiment will be mainly described.

A barrier film 20 of this embodiment is different from that in the first embodiment in that other layers are interposed between surfaces of a base 11 and first and second barrier layers 141 and 142. That is, the barrier film 20 has an underlayer 121 and a third barrier layer 131 between the base 11 and the first barrier layer 141, and has an underlayer 122 and a fourth barrier layer 132 between the base 11 and the second barrier layer 142.

(Underlayer)

The underlayers 121 and 122 are formed on the surfaces of the base 11, respectively, for the purpose of increasing smoothness of the surfaces. The constituent materials of the underlayers 121 and 122 are not particularly limited, but a translucent resin material is typically used. As this kind of resin material, an energy ray curing resin such as an ultraviolet curing resin is suitable, and target transparency and surface flatness can be obtained. For example, an acrylic ultraviolet curing resin is used as the ultraviolet curing resin.

The thicknesses of the underlayers 121 and 122 are not particularly limited, and they have a sufficient thickness to improve the flatness of the surfaces of the base 11. For example, they have a thickness equal to or greater than 5 μm and equal to or less than 50 μm. The thicknesses of the underlayers 121 and 122 may be equal to or greater than 10 μm and equal to or less than 30 μm in accordance with the surface roughness of the used base 11, the viscosity of the ultraviolet curing resin, and the like.

The underlayers 121 and 122 are formed by irradiating an uncured ultraviolet curing resin, which is applied to the surfaces of the base 11, with ultraviolet rays. A method of applying an ultraviolet curing resin is not particularly limited, and an appropriate applying technique such as a spin-coating method, a roll-coating method or a barcode method can be used.

(Third and Fourth Barrier Layers)

The third and fourth barrier layers 131 and 132 are made of a translucent inorganic material having a water vapor barrier property. Examples of this kind of inorganic material include oxides, nitrides and the like including at least one of metal elements such as Al, Zn, Si, Cr, Zr, Cu and Mg.

A method of forming the third and fourth barrier layers 131 and 132 is not particularly limited, and various thin film forming techniques such as a sputtering method, a vacuum deposition method, a CVD method, and a sol-gel method can be used. The thicknesses of the third and fourth barrier layers 131 and 132 are not particularly limited, and for example, the thickness is equal to or greater than 10 nm and equal to or less than 100 nm. When considering film formation uniformity and productivity, the barrier layers 131 and 132 have a thickness equal to or greater than 10 nm and equal to or less than 50 nm.

In this embodiment, the third and fourth barrier layers 131 and 132 are made of a Si—Cr—Zr oxide and formed on front surfaces of the underlayers 121 and 122 by a sputtering method. Since the underlayers 12 are formed on the surfaces of the base 11, the third and fourth barrier layers 131 and 132 are formed on the base 11 with a high covering property (coverage property) even when the surface roughness of the base 11 is relatively high.

Typically, a sintered compact of a Si—Cr—Zr oxide is used as a sputtering target for forming the third and fourth barrier layers 13. Besides this, the barrier layers 131 and 132 may be formed by sputtering respective targets of $SiO_2$, $Cr_2O_3$ and $ZrO_2$ at the same time or sputtering respective targets of Si, Cr and Zr at the same time in an oxygen atmosphere.

(First and Second Barrier Layers)

The first and second barrier layers 141 and 142 are formed on the third and fourth barrier layers 131 and 132 by an ALD method. The film forming pressure is, for example, in the range of 0.3 to 10 Torr (39.99 to 1333 Pa). Upon film formation, the film forming device 100 shown in FIG. 3 can be used. In this case, as a base which is transported in the chamber, a laminate of the base 11, the underlayers 121 and 122, and the third and fourth barrier layers 131 and 132 is used.

The barrier film 20 of this embodiment configured as described above has the third and fourth barrier layers 131 and 132 having a water vapor barrier property in addition to the first and second barrier layers 141 and 142. Accordingly, the water vapor transmission rate can be further reduced in comparison with a case of a barrier layer configured to have only the first and second barrier layers 141 and 142.

In addition, by providing the first and second barrier layers 141 and 142 which are formed by ALD as the outermost layers, the water vapor barrier property can be improved in comparison with a case in which the third and fourth barrier layers 131 and 132 are provided as the outermost layers.

As described above, the embodiments of the present disclosure have been described, but the present disclosure is not limited thereto, and various modifications can be made on the basis of the technical idea of the present disclosure.

For example, in the above-described embodiments, the uppermost layer (outermost layer) of the barrier film is formed of an ALD layer. However, a protective layer for increasing the durability of the ALD layer may be further formed thereon.

In the above-described second embodiment, the underlayers 121 and 122 are made of an ultraviolet curing resin. However, in place of this, the underlayers 121 and 122 may be formed of an ALD layer of aluminum oxide. Otherwise, the underlayers may be formed to have a laminate structure of an ultraviolet curing resin layer and an ALD layer of aluminum oxide. In this case, the ultraviolet curing resin layer is formed on a base side and the ALD layer is formed thereon. The water vapor barrier property can be improved even when the underlayers have such a structure.

Furthermore, in the above-described embodiments, the barrier film which is applied to organic EL displays, solar cell modules and the like has been described as an example. However, the application target is not limited thereto, and the barrier film can be applied as a member of all of products which may have a water vapor barrier property. For example, the barrier film can be applied to display devices, portable electronic devices, semiconductor devices, cells, packing members and the like. Here, examples of the display devices include liquid crystal displays, plasma displays, touch panels, electronic papers, and the like other than the above-described organic EL displays. Examples of the portable electronic devices include mobile phones, portable music players, data cards and the like, and also includes devices having a display function. Examples of the semiconductor devices include Thin Film Transistors (TFTs), IC chips, IC tags, semiconductor memories, semiconductor sensors, Micro Electro Mechanical System (MEMS) elements, photoelectric conversion elements which are incorporated in a solar cell module, and the like. Examples of the cells include primary cells, secondary cells such as lithium-ion cells, fuel cells, storage cells, and the like. In addition, the present disclosure can also be applied to other electric and electronic devices which may have a water vapor barrier property. In addition, the present disclosure can also be applied to packing members for food, precision measuring equipment, cards, art objects, and the like.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A barrier film comprising:
a base which is formed of a plastic film having a first surface and a second surface opposed to the first surface;
a first barrier layer which is formed on the first surface by an atomic layer deposition method and is made of an inorganic material having a water vapor barrier property; and
a second barrier layer which is formed on the second surface by an atomic layer deposition method and is made of an inorganic material having a water vapor barrier property,
wherein the first and second barrier layers are aluminum oxide films which are formed at a pressure greater than 0.5 Torr and equal to or less than 3 Torr, and
wherein the barrier film has a water vapor transmission rate from $10 \times 10^{-5}$ to $10^{-7}$ [$g/m^2/day$].

2. The barrier film according to claim 1,
wherein the first and second barrier layers have a thickness equal to or greater than 20 nm and equal to or less than 50 nm.

3. The barrier film according to claim 1, further comprising:
a third barrier layer which is formed by a sputtering method between the first surface and the first barrier layer and is made of an inorganic material having a water vapor barrier property.

4. The barrier film according to claim 1, further comprising:
a third barrier layer which is formed by a sputtering method between the first surface and the first barrier layer and is made of an inorganic material having a water vapor barrier property; and
a fourth barrier layer which is formed by a sputtering method between the second surface and the second barrier layer and is made of an inorganic material having a water vapor barrier property.

5. A display device comprising the barrier film according to claim 1.

6. A portable electronic device comprising the barrier film according to claim 1.

7. A semiconductor device comprising the barrier film according to claim 1.

8. A cell comprising the barrier film according to claim 1.

9. A packing member comprising the barrier film according to claim 1.

* * * * *